United States Patent [19]

Van De Werken

[11] 4,197,494

[45] Apr. 8, 1980

[54] ELECTROMAGNETIC DEVICE WITH MAGNETIC NULL MEANS

[76] Inventor: Walter A. Van De Werken, 5147 S. Perry St., Littleton, Colo. 80123

[21] Appl. No.: 885,583

[22] Filed: Mar. 13, 1978

[51] Int. Cl.² .............................................. G01R 1/20
[52] U.S. Cl. .................................................... 324/146
[58] Field of Search .................. 324/146, 147, 151 R, 324/154

[56] References Cited

U.S. PATENT DOCUMENTS

| | | | |
|---|---|---|---|
| 3,275,936 | 9/1966 | Huston | 324/146 |
| 3,867,696 | 2/1975 | Raymond | 324/146 |

*Primary Examiner*—M. Tokar
*Attorney, Agent, or Firm*—Ancel W. Lewis, Jr.

[57] ABSTRACT

An electromagnetic device is disclosed for use in a polygraph instrument for moving a recording pen in response to sensed electric current. The device includes a movable magnet that is rotated by a magnetic field produced by the sensed current flowing through the coil of an electromagnet. Null magnets are releasably held at selected positions and in a particular arrangement relative to the movable magnet and have their respective magnetic field strengths and positions such that they automatically return the movable magnet to a null position when the current being sensed is removed from the coil.

15 Claims, 3 Drawing Figures

ELECTROMAGNETIC DEVICE WITH MAGNETIC NULL MEANS

FIELD OF THE INVENTION

This invention relates to a novel and improved electromagnetic device including an adjustable magnetic null means that is particularly suitable for use in polygraph instruments.

BACKGROUND OF THE INVENTION

A variety of current-sensitive electromagnetic devices have been provided which are sensitive to and are indicative of the strength of an electric current. There are a variety of galvanometers that are presently in use for this purpose. One problem faced with presently available galvanometers that are used in polygraph instruments is that they are relatively expensive and require rather sophisticated electromagnetic and null structure such as torsion rods or counter-opposed springs to return the instrument to a null or zero position. Moreover, presently available galvanometers are not entirely satisfactory for use with the amplified electric signals developed in polygraph instruments.

Accordingly, it is an object of the present invention to provide a simple, durable, relatively inexpensive, and yet highly sensitive electromagnetic device.

Another object of this invention is to provide a novel and improved electromagnetic device that has adjustable sensitivity and adjustable frequency response with the capability of adjusting the device for a null or zero reference with relative ease.

Still another object of this invention is to provide a novel electromagnetic device that is compatible with the electric signals produced by the amplifier stage of a polygraph instrument.

A further object of this invention is to provide a novel electromagnetic device that virtually eliminates backlash and is highly sensitive over a wide frequency range without the use or necessity of relatively complex and costly null mechanisms.

SUMMARY OF THE INVENTION

A novel and improved electromagnetic device with an adjustable magnetic null arrangement has adjustable sensitivity and adjustable frequency response with the capacity of ready adjustment to a null position. The device has a movable permanent bar magnet that freely rotates about a fixed axis and electromagnet disposed relative to the movable magnet such that its energization by either an AC or a DC current causes a deflection of the movable magnet from a null position. Null magnets, preferably of a permanent bar type, corresponding size, shape and magnetic strength, and spaced at equal distance intervals from the movable magnet, exert forces that cause the movable magnet to return to the null position when no electric current is applied to the electromagnet. A cover plate cooperates with the support for the null magnets to releasably clamp them in a selected coplanar position for adjustment of the null magnets to change the sensitivity, null position, and frequency response of the movable magnet as required.

Other objects, advantages and capabilities of the present invention will become more apparent as the description proceeds, taken in conjunction with the accompanying drawings in which like parts have similar reference numerals and in which.

DESCRIPTION OF THE PREFERRED EMBODIMENTS

Figure 1:
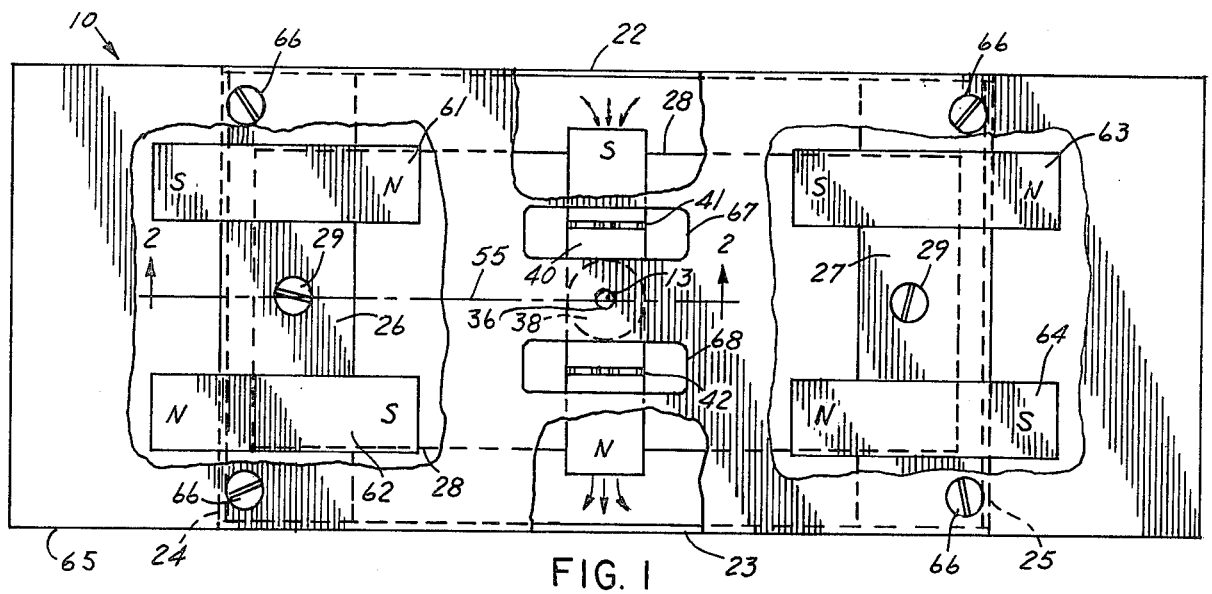
FIG. 1 is a top plan view of an electromagnetic device embodying features of the present invention with portions broken away to show interior construction.
Figure 2:
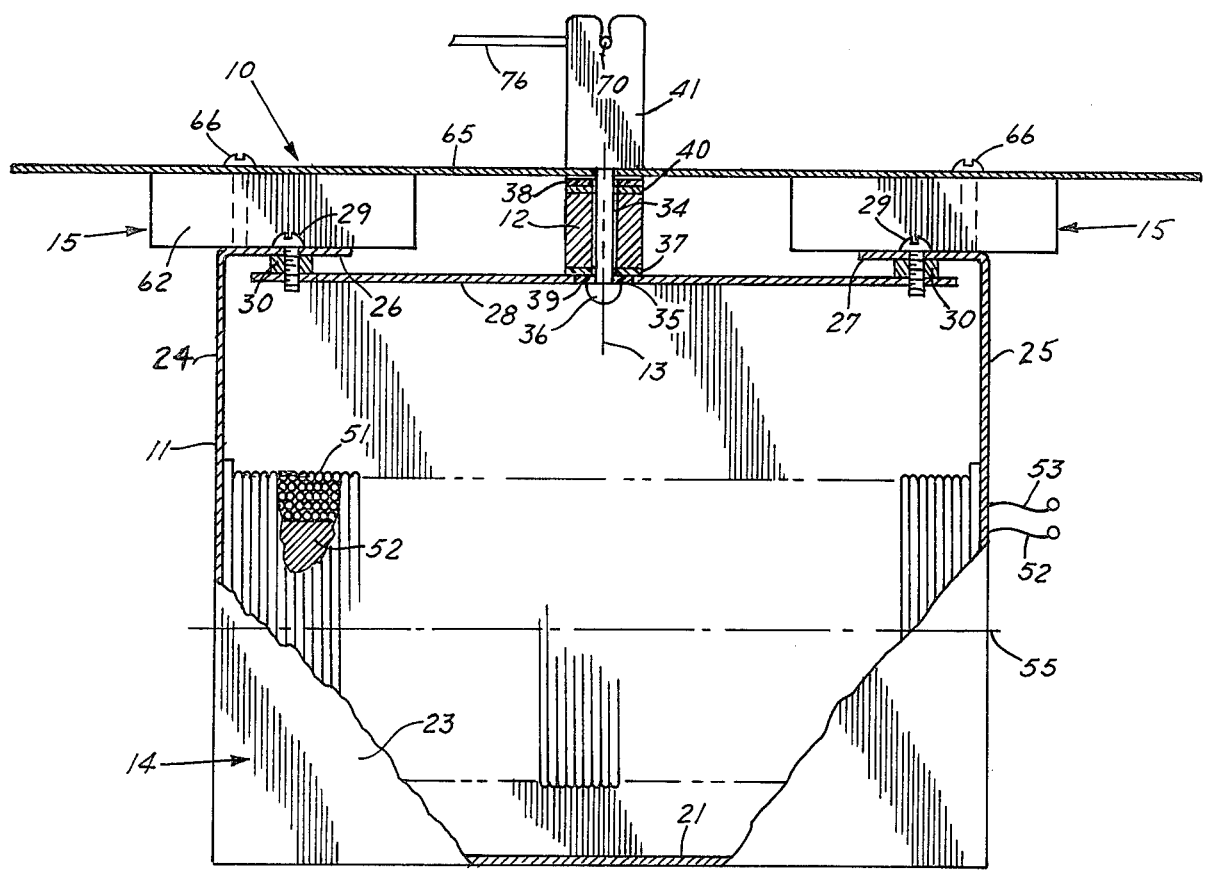
FIG. 2 is a sectional view taken along lines 2—2 of FIG. 1 with the lower portion of the support body in side elevation and broken away to show interior construction.

Referring now to the drawings, the electromagnetic device 10 shown, in general, includes a support body 11, a movable magnet 12 on said support body for free rotation about a fixed axis 13, an electromagnet 14 supported within the support assembly below the movable magnet 12, and a null assembly 15 on the support assembly in a juxtaposed relation to the movable magnet 12.

The support body 10 is oblong, hollow, and box-shaped with a bottom wall 21, a pair of opposed, spaced, side walls 22 and 23, a pair of opposed, spaced, end walls 24 and 25, and further has inturned top flanges 26 and 27 projecting in at the top of each end wall 24 and 25, respectively, together with an upper support plate 28 disposed below the top flanges and above the bottom wall, which is shown as removably held thereto by two oppositely disposed screw fasteners 29.

The movable magnet 12 is bipolar and in the form of an oblong-shaped, flat-surfaced permanent bar magnet having poles of opposite polarity designated N and S at the opposite end portions thereof and is provided with a central bore or aperture 34. Movable magnet 12 is mounted for rotation about a fixed axis oriented in a vertical disposition on the support plate 28. The mounting for the movable magnet is provided by a central aperture 35 in plate 28 through which a pivot member 36 extends.

In a preferred form the support plate 28 and pivot member 36 are of an electrically conductive metal and an insulator washer 39 is fitted in the aperture 35 to provide electric insulation between the metal plate 28 and metal pivot member 36 to electrically insulate one from the other. The pivot member 36 via washer 39 is rigidly affixed to plate 28 and the external diameter thereof is sized to be smaller than the bore 34, and a lower washer 37 made of a non-conductor such as nylon is mounted between magnet 12 and plate 28 so that the magnet 12 will rotate freely thereon.

A generally U-shaped pen support is affixed to the top of the movable magnet and includes a base 40 secured to the top surface of the magnet 12 with a pair of laterally spaced, upright pen support arms 41 and 42. The pivot member 36 extends up through an aperture in the base 40 and an upper insulator washer 38 like washer 27 is disposed on base 40. The apertures in base 40 and washer 38 are sized larger than the external diameter of the pivot member 26 to slide freely thereon for ease of assembly.

The electromagnet 11 includes a coil of wire 51 that terminates in end leads 52 and 53 to which electric current is applied and wound on a soft iron core 54 that is mounted within the support body below the movable magnet 12. The longitudinal axis 55 of the electromagnet and core is arranged perpendicular to and intersecting the fixed vertical axis about which the movable magnet rotates so that, when the coil is energized by an electric current flowing therethrough, there is an interaction between their magnetic fields which causes the movable magnet to rotate about a fixed axis from a null position to a deflected position that is angularly disposed relative to the position shown in FIG. 1.

The null assembly 15 for returning the movable magnet 12 to a null or zero position shown includes a first set of null magnets 61 and 62 and a second set of null magnets 63 and 64 that are removably clamped at selected positions between an upper cover plate 65 and the support plate, disposing these null magnets substantially in a common horizontal plane. The cover plate 65 is releasably fastened to the support body at each corner thereof and spaced in parallel relation thereto above the support plate by means of four screw fasteners 66 that are threaded down into the flanges 26 and 27. The cover plate has a pair of oppositely disposed, generally rectangularly shaped pen support arm receiving slots 67 and 68 that have inside edges that serve as stops to limit the extent of swing of the movable magnet by virtue of having the pen support arms 41 and 42 moving to engage the inside edges upon the movement of the movable magnet to the deflected position.

Each null magnet 61, 62, 63 and 64 is of a corresponding size and shape and of approximately equal magnetic strength. Each null magnet is an oblong-shaped bipolar permanent bar magnet with six smooth flat surfaces and has a longitudinal axis along a common line that is arranged perpendicular to the longitudinal axis of the movable magnet. These sets of magnets shown are each located an equal distance from the movable magnet that is selected to exert the necessary force on the movable magnet to cause the movable magnet to return to the null position.

The sensitivity of the null assembly to current in the coil is variable by changing the spacing between the movable magnet and the null magnets. The fact that the cover plate 65 has a smooth flat bottom surface, the null magnets have smooth flat top and bottom surfaces, and the flanges on which the null magnets rest are smooth and flat facilitates the movement of the null magnets to a range of different positions relative to the movable magnet. The movable magnet 12 has the same height as the null magnets and is slightly below the plane of the null magnets due to the thickness of base 40 and upper insulator washer 38, but may be considered substantially coplanar with the null magnets.

Each set of null magnets has a pole with a polarity that exerts a force on the movable magnet to cause it to rotate in one direction about axis 13 with the force applied by the first set of null magnets opposite and equal to that applied by the second set of null magnets, so that the null magnets tend to return the movable magnet to precisely a null position. If the magnetic strength of any of the set of null magnets differs or varies, its position can be changed by rotating the fasteners 66 to release one of the null magnets, moving that null magnet toward or away from the movable magnet, and then clamping both to a fixed position relative to the other null magnets and the movable magnet. Again the null position is the one at which the longitudinal axis of the movable magnet is disposed perpendicular to the longitudinal axes of each of the sets of null magnets.

It is understood that null magnets may be used which are of equal strength at equal distance intervals and at only two diagonally opposite positions, each tending to cause the movable magnet to rotate in opposite directions. However, this arrangement has been found to have a lesser frequency response.

Figure 3:
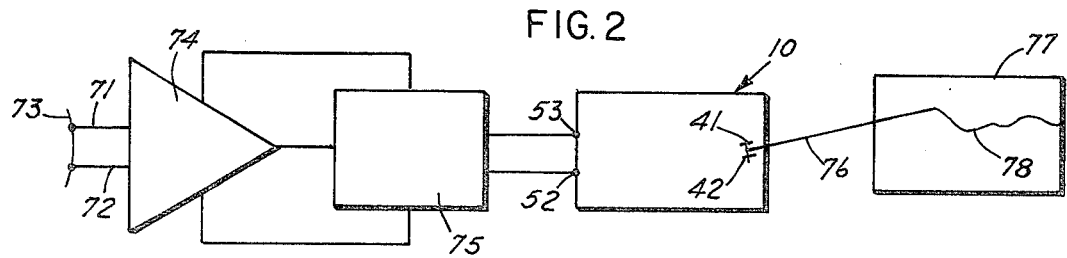
FIG. 3 is a schematic diagram showing the present invention connected in a polygraph circuit.

Referring now to FIG. 3, there is shown a circuit diagram for a polygraph instrument which includes a pair of input lines 71 and 72 coupled to a source of electric current 73, such as a member or portion of a human body, with electric currents generated by the body being amplified by amplifier 74 and coupled via control 75 to the pair of input lines 52 and 53 of the above-described electromagnetic device 10. The recording pen 76, having one end affixed to a cross rod 70 in slots of arms 41 and 42, is moved over a polygraph chart 77 to mark the chart, as indicated at 78, in a conventional manner.

The device of the present invention has been found to be highly effective in responding to the amplified AC or DC electric current signals provided at the output of the amplifier 74 and moving the recording pen 76 with a high degree of sensitivity and without backlash. The change of position and spacing of the null magnets changes the extent of deflection of the pen relative to the polygraph chart 77.

Although the present invention has been described with a certain degree of particularity, it is understood that the present disclosure has been made by way of example and that changes in details of structure may be made without departing from the spirit thereof.

What is claimed is:

1. An electromagnetic device comprising:
    a movable magnet having poles of opposite polarity supported for rotation about an axis;
    an electromagnet disposed relative to said movable magnet to cause said movable magnet to move from a null position to a deflected position when said electromagnet is energized by an electric current; and
    magnetic null means for exerting substantially equal forces at each of said poles of opposite polarity tending to rotate said movable magnet in opposite directions to return said movable magnet to the null position when no electric current is being applied to said electromagnet, said magnetic null means including at least a first magnet adjacent one of said poles for exerting a force on said movable magnet in one direction and a second magnet adjacent the other of said poles for exerting a force on said movable magnet in the opposite direction.

2. An electromagnetic device as set forth in claim 1 wherein said movable magnet is a permanent bar magnet and said magnetic null means includes a first set of permanent bar null magnets on opposite sides of one of the poles of said movable magnet and a second set of permanent bar null magnets on opposite sides of the other pole of said rotatable magnet.

3. An electromagnetic device as set forth in claim 2 wherein said first and second sets of null magnets are arranged in a common plane and said movable magnet is arranged in approximately the same plane as said null magnets.

4. An electromagnetic device as set forth in claim 2 wherein each of said null magnets is movable to a position a selected distance from one another and each is movable to a position a selected distance from said movable magnet.

5. An electromagnetic device as set forth in claim 2 wherein a longitudinal axis of each of said null magnets of said first set extending through the poles of opposite polarity of each of said first set of null magnets is along a common line that is perpendicular to a longitudinal axis of said movable magnet extending through the poles of opposite polarity of said movable magnet and a longitudinal axis of each of said null magnets of said second set extending through the poles of opposite polarity of said second set of null magnets is along a common line that is perpendicular to a longitudinal axis of said movable magnet extending through the poles of opposite polarity of said movable magnet.

6. An electromagnetic device as set forth in claim 2 wherein the end portions of said first set of magnets are spaced a selected, equal distance from one end portion of said movable magnet and the magnetic strengths of said first set of magnets are approximately equal.

7. An electromagnetic device as set forth in claim 1 including a common support means for said movable magnet, electromagnet and magnetic null means.

8. An electromagnetic device as set forth in claim 7 wherein said common support means includes a hollow, box-shaped support body with an upper support plate on which said movable and null magnets are disposed, and a cover plate above said top support plate releasably clamping said null magnets in a fixed position relative to said movable magnet.

9. An electromagnetic device as set forth in claim 7 wherein said movable magnet has a pair of opposed, spaced, upstanding pen support arms.

10. An electromagnetic device as set forth in claim 8 wherein said cover plate has a pair of slots through which said pen support arms extend.

11. An electromagnetic device as set forth in claim 1 wherein said movable magnet has an aperture and an upstanding pivot member mounted on said support plate extending through said aperture to support said movable magnet for free rotation about an axis.

12. An electromagnetic device as set forth in claim 11 further including a first insulator washer on said pivot member below said movable magnet and a second electric insulating washer on said pivot member above said movable magnet and under said cover plate.

13. An electromagnetic device as set forth in claim 11 wherein said pivot member is electrically insulated from said support plate.

14. An electromagnetic device comprising:
an oblong, hollow, box-shaped support body with a bottom wall, a pair of opposed, spaced side walls, a pair of opposed, spaced end walls, an inturned top flange projecting in from said end walls, a support plate recessed below said top flange above said bottom wall and removably held thereto by fasteners;

a movable, bipolar, permanent bar magnet disposed on said support plate having a central aperture through which a stationary pivot member extends to support said magnet for free rotation about a fixed axis of rotation, said movable magnet having a pair of upstanding, spaced, parallel pen support arms affixed thereto;

an electromagnet including a coil wound on a soft iron core mounted in said support body below said movable magnet having a longitudinal axis substantially perpendicular to the axis about which said movable magnet rotates whereby, when said coil is energized by an electric current flowing therethrough, the interaction between the respective magnetic fields of said electromagnet and said movable magnet causes the movable magnet to rotate about said axis from a null position to a deflected position;

a first set of permanent bar magnets and a second set of permanent bar magnets mounted on said support plate with said movable magnet, each of said sets of null magnets having a longitudinal axis along a common line that is substantially perpendicular to the longitudinal axis of said movable magnet and having approximately equal magnetic field strengths and spaced approximately an equal distance from said movable magnet, said first set of null magnets having a polarity that exerts a force on the movable magnet to cause its rotation in one direction and said second set of null magnets having a polarity that exerts an equal force in the opposite direction to cause said movable magnet to return to a null position when no electric current is being applied to said coil; and a cover plate releasably fastened to the top of said support body above said support plate releasably clamping said null magnets in a fixed position relative to said movable magnet, said cover plate having a pair of slots through which said pen support arms extend with edge portions defining said slots forming a stop to limit the extent of deflection of said movable magnet.

15. An electromagnetic device as set forth in claim 14 wherein said null magnets, cover plate and support body have cooperating coplanar surfaces to facilitate the positioning of said null magnets at a range of positions in the same plane to adjust the sensitivity, frequency response and deflection of said movable magnet.

* * * * *